(12) United States Patent
Duquesne et al.

(10) Patent No.: US 12,161,063 B2
(45) Date of Patent: Dec. 10, 2024

(54) SYSTEMS AND METHODS FOR MONITORING THE OPERATIONAL STATUS OF PASSIVE LIFT SUPPPORTS AND RELATED WORK MACHINES

(71) Applicant: CNH Industrial America LLC, New Holland, PA (US)

(72) Inventors: Frank R. G. Duquesne, Zwevegem (BE); Craig Michael Cless, Gilbertsville, PA (US); Nathan E. Isaac, Lancaster, PA (US); Gilles Mommerency, Oostnieuwkerke (BE)

(73) Assignee: CNH Industrial America LLC, New Holland, PA (US)

( * ) Notice: Subject to any disclaimer, the term of this patent is extended or adjusted under 35 U.S.C. 154(b) by 394 days.

(21) Appl. No.: 17/672,169

(22) Filed: Feb. 15, 2022

(65) Prior Publication Data
US 2023/0255141 A1    Aug. 17, 2023

(51) Int. Cl.
*A01D 41/00* (2006.01)
*A01D 41/12* (2006.01)
(Continued)

(52) U.S. Cl.
CPC ....... *A01D 41/127* (2013.01); *A01D 41/1243* (2013.01); *G01R 19/16571* (2013.01)

(58) Field of Classification Search
CPC .............. A01D 41/127; A01D 41/1243; G01R 19/16571
(Continued)

(56) References Cited

U.S. PATENT DOCUMENTS 10,306,834 B2   6/2019  Ballegeer et al.
2018/0192587 A1  7/2018  Berggren
(Continued)

FOREIGN PATENT DOCUMENTS

CN    205336872      6/2016
EP    1074175 A1     2/2001
(Continued)

OTHER PUBLICATIONS

Extended European Search Report for EP Application No. 23156653.0 dated Jul. 12, 2023 (nine pages).

*Primary Examiner* — Tiffany P Young
(74) *Attorney, Agent, or Firm* — Peter K. Zacharias; Rebecca L. Henkel; Rickard K. DeMille

(57) ABSTRACT

In one aspect, a system for monitoring the operational status of passive lift supports includes an actuatable component configured to be moved across a range of movement between a first position and a second position, and an actuator coupled to the component and being configured to actuate the component across the range of movement. The system also includes a passive lift support coupled to the component and being configured to provide a supplemental actuation force as the actuator is being used to actuate the component across the range of movement. In addition, the system includes a computing system configured to monitor a load-related parameter indicative of a load being carried by the actuator. The computing system is further configured to determine an operational status of the passive lift support based at least in part on the monitored load-related parameter.

20 Claims, 6 Drawing Sheets

(51) Int. Cl.
   *A01D 41/127* (2006.01)
   *G01R 19/165* (2006.01)
(58) Field of Classification Search
   USPC .......................................................... 701/50
   See application file for complete search history.

(56) References Cited

U.S. PATENT DOCUMENTS

| | | | |
|---|---|---|---|
| 2018/0243702 A1 | 8/2018 | Post et al. | |
| 2021/0038147 A1* | 2/2021 | Cohen | A61B 5/1121 |
| 2021/0276850 A1* | 9/2021 | Lombardo | B66F 11/044 |

FOREIGN PATENT DOCUMENTS

| | | |
|---|---|---|
| JP | 2009/023624 | 2/2009 |
| JP | 2010/100236 | 5/2010 |
| JP | 2016/141205 | 8/2016 |
| WO | 2014017958 A1 | 1/2014 |
| WO | 2020096942 A1 | 5/2020 |
| WO | WO-2022241218 A1 * | 11/2022 |

* cited by examiner

SYSTEMS AND METHODS FOR MONITORING THE OPERATIONAL STATUS OF PASSIVE LIFT SUPPPORTS AND RELATED WORK MACHINES

FIELD OF THE INVENTION

The present subject matter relates generally to the use of passive lift supports in connection with actuatable components, and, more particularly, to systems and methods for monitoring the operational status of a passive lift support.

BACKGROUND OF THE INVENTION

Work machines, such as construction and agricultural vehicles, implements, and/or the like, often include one or more components configured to be actuated or moved between two or more positions, such as a storage position and an operating position. To achieve such actuation of the component(s), a work vehicle typically includes one or more actively controlled actuators, such as one or more hydraulic, pneumatic, and/or electric actuators, coupled between the component(s) and a separate, adjacent structure (e.g., a stationary component of vehicle, such as a frame component). In this regard, depending on the size, weight, shape, and/or configuration of the component(s), two or more actuators may be coupled between the component(s) and the adjacent structure to allow the component(s) to be actuated or moved relative to the adjacent structure via operation of the actuators.

Unfortunately, actively controlled actuators are often quite expensive and, thus, the use of two or more actuators to control/support the movement of a given vehicle component(s) can result in a significant increase in the overall cost of the associated machine. To provide a more cost effective solution, it has been recently proposed to use a passive lift support (e.g., a gas strut) as a replacement for one or more of the actuators used in association with a given actuatable component. However, passive lift supports typically have relatively short service lives as compared to actuators and will weaken over time, thereby increasing the load that must otherwise be carried by the actuator(s) that is supporting the associated component.

Accordingly, systems and methods for monitoring the operational status of a passive lift support would be welcomed in the technology.

BRIEF DESCRIPTION OF THE INVENTION

Aspects and advantages of the invention will be set forth in part in the following description, or may be obvious from the description, or may be learned through practice of the invention.

In one aspect, the present subject matter is directed to a system for monitoring the operational status of passive lift supports. The system includes an actuatable component configured to be moved across a range of movement between a first position and a second position, and an actuator coupled to the component and being configured to actuate the component across the range of movement. The system also includes a passive lift support coupled to the component and being configured to provide a supplemental actuation force as the actuator is being used to actuate the component across the range of movement. In addition, the system includes a computing system configured to monitor a load-related parameter indicative of a load being carried by the actuator. The computing system is further configured to determine an operational status of the passive lift support based at least in part on the monitored load-related parameter.

In another aspect, the present subject matter is directed to a work machine including a frame, an actuatable component supported for movement relative to the frame across a range of movement between a first position and a second position, and an actuator coupled to the component and being configured to be extended or retracted along a stroke length to actuate the component across the range of movement. The work machine also includes a passive lift support coupled to the component and being configured to provide a supplemental actuation force as the actuator is being used to actuate the component across the range of movement. In addition, the work machine includes a computing system configured to monitor a load-related parameter indicative of a load being carried by the actuator and compare the monitored load-related parameter to at least one threshold. The computing system is further configured to determine an operational status of the passive lift support based on the comparison between the monitored load-related parameter and the at least one threshold.

In a further aspect, the present subject matter is directed to a method for monitoring the operational status of a passive lift support. The method includes controlling, with a computing system, an operation of an actuator such that an actuatable component coupled to the actuator is actuated across a range of movement between a first position and a second position. The passive lift support is coupled to the actuator and being configured to provide a supplemental actuation force as the actuator is being used to actuate the component across the range of movement. The method also includes monitoring, with the computing system, a load-related parameter indicative of a load being carried by the actuator as the component is being actuated across the range of movement, and determining, with the computing system, an operational status of the passive lift support based at least in part on the monitored load-related parameter.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Figure 1:
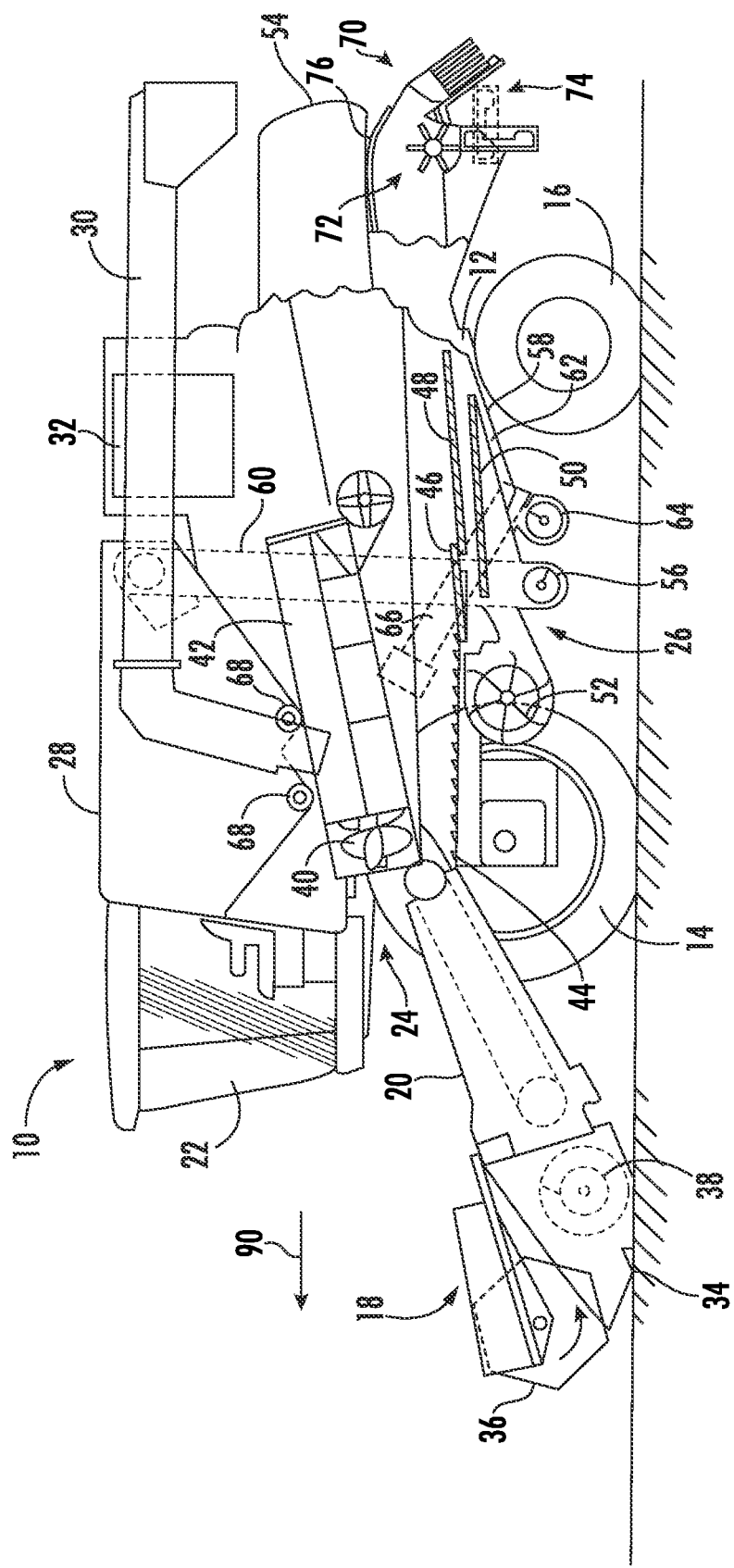
FIG. 1 illustrates a simplified, partial sectional side view of one embodiment of a work machine in accordance with aspects of the present subject matter, particularly illustrating the work machine configured as an agricultural harvester.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In general, the present subject matter is directed to systems and methods for monitoring the operational status of passive lift supports, such as gas-charged lift supports. Specifically, in several embodiments, the present subject matter relates to monitoring the operational status of a passive lift support that is coupled to an actuatable component and that is configured to provide an additional or supplemental actuation force to assist a separate actuator in moving the component across a given range of movement. For instance, the passive lift support and the actuator may be separately coupled to the component, with the actuator configured to be actively controlled to actuate the component across a range of movement between a first position and a second position.

In accordance with aspects of the present subject matter, the disclosed systems and methods may be used to automatically monitor the operational status of the passive lift support to allow a determination to be made as to when the lift support needs to be replaced. Specifically, in several embodiments, a computing system may be configured to automatically monitor a parameter associated with the actuator that is indicative of the proportion of the load being carried by or applied through the actuator (e.g., as opposed to the passive lift support) as the actuatable component is being moved across its range of movement. In such embodiments, the computing system may, for instance, be configured to compare the monitored load-related parameter to a corresponding threshold (e.g., a predetermined threshold value) to determine when the proportion of the load being carried by the actuator exceeds a given magnitude, thereby indicating that the passive lift support likely needs to be replaced.

It should be appreciated that, for purposes of discussion, the present subject matter will generally be described in the context of passive lift supports used in association with actuatable components for work machines, such as a residue spreader for an agricultural harvester. However, it should be appreciated that the disclosed systems and methods may be advantageously applied to monitor the operational status of passive lift supports used in association with any other suitable actuatable components, such as actuatable components configured for use within any other suitable machines, assemblies, sub-systems, and/or the like Referring now to the drawings, FIG. 1 illustrates a schematic, side view of one embodiment of a work machine in accordance with aspect of the present subject matter. In the illustrated embodiment, the work machine is configured as an agricultural vehicle, namely an agricultural harvester 10 in the form of a combine. However, in other embodiments, the work machine may correspond to any other suitable agricultural vehicle, such as a tractor, windrower, sprayer, and/or the like. Moreover, it should be appreciated that, in addition to agricultural vehicles, the work machine may also correspond to various other types of work machines, including construction vehicles, agricultural implements, and/or the like.

As shown in FIG. 1, the harvester 10 generally includes a chassis or frame 12, ground engaging wheels 14, 16, a header 18, a feeder housing 20, an operator cab 22, a threshing and separating system 24, a cleaning system 26, a grain tank 28, and an unloading conveyor 30. Unloading conveyor 30 is illustrated as an unloading auger, but can also be configured as a belt conveyor, chain elevator, etc.

The front wheels 14 may be larger flotation type wheels, while the rear wheels 16 may be smaller steerable wheels. Motive force is selectively applied to the front wheels 14 through a power plant in the form of a diesel engine 32 and a transmission (not shown). Although the harvester 10 is shown as including wheels, it is also to be understood that the harvester 10 may include tracks, such as full tracks or half-tracks.

The header 18 is mounted at the front of the harvester 10 and includes a cutter bar 34 for severing crops from a field during forward motion of harvester 10. A rotatable reel 36 feeds the crop into the header 18, and a double auger 38 feeds the severed crop laterally inwardly from each side toward the feeder housing 20. The feeder housing 20 conveys the cut crop to threshing and the separating system 24, and is selectively vertically movable using one or more actuators, such as hydraulic cylinders (not shown).

The threshing and separating system 24 is of the longitudinal orientation type, and generally includes a rotor 40 at least partially enclosed by and rotatable within a corresponding perforated concave 42. The cut crops are threshed and separated by the rotation of the rotor 40 within the concave 42, and larger elements, such as stalks, leaves and the like are discharged from the rear of the harvester 10. Smaller elements of crop material including grain and non-grain crop material, including particles lighter than grain, such as chaff, dust and straw, are discharged through perforations of the concave 42.

Grain that has been separated by the threshing and separating system 24 falls onto a grain pan 44 and is conveyed toward the cleaning system 26. The cleaning system 26 may include an optional pre-cleaning sieve 46, an upper sieve 48 (also known as a chaffer sieve), a lower sieve 50 (also known as a cleaning sieve), and a cleaning fan 52. Grain on the sieves 46, 48 and 50 is subjected to a cleaning action by the fan 52, which provides an airflow through the sieves, to remove chaff and other impurities such as dust from the grain by making this material airborne for discharge from the straw hood 54 of the harvester 10. The grain pan 44 and the pre-cleaning sieve 46 oscillate in a fore-to-aft manner to transport the grain and finer non-grain crop material to the upper surface of the upper sieve 48. The upper sieve 48 and the lower sieve 50 are vertically arranged relative to each other, and likewise oscillate in a fore-to-aft manner to spread the grain across sieves 48, 50, while permitting the passage of cleaned grain by gravity through the openings of sieves 48, 50.

Clean grain falls to a clean grain auger 56 positioned crosswise below and in front of the lower sieve 50. The clean grain auger 56 receives clean grain from each sieve 48, 50 and from bottom pan 58 of the cleaning system 26. The clean grain auger 56 conveys the clean grain laterally to a generally vertically arranged grain elevator 60 for transport to the grain tank 28. Tailings from the cleaning system 26 fall to a tailings auger trough 62. The tailings are transported via tailings auger 64 and the return auger 66 to the upstream end of the cleaning system 26 for repeated cleaning action. The cross augers 68 at the bottom of the grain tank 28 convey the clean grain within the grain tank 28 to the unloading auger 30 for discharge from the harvester 10.

Additionally, a residue handling system 70 is provided at the rear of harvester 10. In general, the residue handling system 70 includes a residue chopper 72 located above a residue spreader 74. As is generally understood, the reside spreader 74 may include one or more spreader elements 75 (FIG. 2), such as one or more rotating, paddled wheels, for spreading the residue discharged at the rear end of the harvester 10. The residue spreader 74 receives two streams of crop residue when in a chopping mode. One stream from the residue chopper 72 and a second stream from the cleaning system 26. The residue spreader 74 discharges the non-grain crop material or residue across the harvested width behind the harvester 10. Additionally, the residue handling system 70 may also include a mode selection door 76 located above the residue chopper 72 and being pivotable between two positions (i.e., a windrow mode and a chopping mode) such that the first stream of crop is either diverted to the residue chopper 72 (chopping mode) or over the residue chopper 72 to form a windrow (windrow mode). As is generally understood, the residue spreader 74 may pivot about a transverse axis between a vertically oriented operating position (shown in solid lines) and a horizontally oriented storage or service position (shown in dashed lines). A windrow chute (not shown) may also be provided that can be attached to the spreader 74 and rotates with the spreader 74 as it is actuated between its operating and storage positions.

Figure 2:
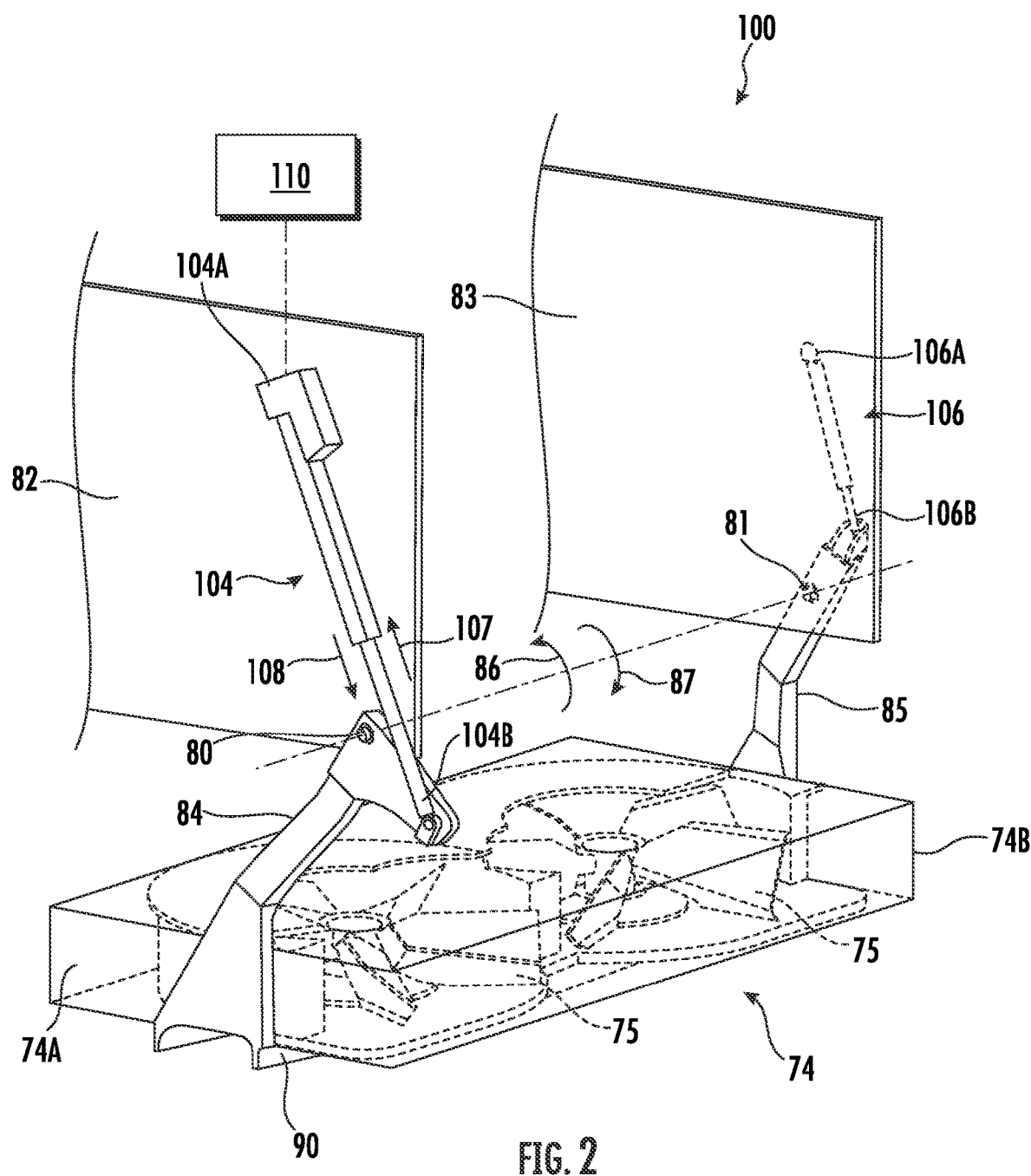
FIG. 2 illustrates a simplified, schematic view of one embodiment of a system for monitoring the operational status of passive lift supports in accordance with aspects of the present subject matter, particularly illustrating the system including an actuator and lift support coupled to a residue spreader of the harvester shown in FIG. 1 in accordance with aspects of the present subject matter.

Referring now to FIG. 2, a schematic view of one embodiment of a system 100 for monitoring the operational status of a passive lift support is illustrated in accordance with aspects of the present subject matter. For purposes of discussion, the system 100 will generally be described with reference to an actuatable component of the harvester 10 shown in FIG. 1, namely the residue spreader 74 of the harvester 10. However, in alternative embodiments, the disclosed system 100 may be utilized with any other suitable actuatable component of the harvester 10 or of any other work machine that utilizes a combination of at least one actuator and at least one passive lift support for controlling/supporting the movement of such component between different positions/orientations (including linear actuation and/or pivoting motion of the component).

As shown in FIG. 2, the system 100 includes an actuatable component (e.g., the illustrated residue spreader 74) configured to be actuated across a range of movement between a first position (e.g., the horizontally oriented storage position shown in FIG. 2) and a second position (e.g., the vertically oriented operating position shown in solid lines in FIG. 1). For instance, in the illustrated embodiment, the residue spreader 74 is pivotably coupled (e.g., at pivot points 80, 81) to first and second adjacent components 82, 83 of the harvester (e.g., first and second stationary walls or frame components of the rear frame of the harvester 10) via respective first and second pivot arms 84, 85. Specifically, one end of the first pivot arm 84 is pivotably coupled to the first adjacent component 82 at a first pivot point 80 (e.g., via a pinned or bolted connection) and an opposed end of the first pivot arm 84 is coupled to the residue spreader 74 (e.g., at a first lateral end 74A of the spreader 74). Similarly, one end of the second pivot arm 85 is pivotably coupled to the second adjacent component 83 at a second pivot point 81 (e.g., via a pinned or bolted connection) and an opposed end of the second pivot arm 85 is coupled to the residue spreader 74 (e.g., at a second lateral end 74B of the spreader 74). In one embodiment, the first and second pivot arms 84, 85 may also be coupled to each other via a separate support beam 90 extending end-to-end between the arms 84, 85 (e.g., at a location below the residue spreader 74). Regardless, by pivotably coupling the residue spreader 74 to the adjacent components 82, 83 of the harvester 10 via the pivot arms 84, 85, the spreader 74 can be pivoted about the pivot points 80, 81 between its first and second positions, such as by pivoting the spreader 74 about the pivot points 80, 81 in either a first pivot direction (indicated by arrow 86) or a second pivot direction (indicated by arrow 87).

It should be appreciated that, in other embodiments, the actuatable component of the system 100 may correspond to a component that is configured to be linearly actuated relative to an adjacent component(s) (as opposed to be pivotably actuated). In such embodiments, the actuatable component(s) may be supported within the associated agricultural machine in any manner that allows such component to be linearly actuated relative to an adjacent component(s) of the machine.

To facilitate movement of the residue spreader 74 between its first and second positions, the system 100 may also include one or more actuators 104 configured to be actively controlled to actuate or move the component across a range of movement between the respective positions and at least one passive lift support 106 configured to assist the actuator(s) 104 in actuating or moving the spreader 74 (e.g., by providing a supplemental actuation force). In the illustrated embodiment, the system 100 includes a single actuator 104 and a single passive lift support 106. However, in other embodiments, the system 100 may include two or more actuators 104 and/or two or more lift supports 106.

As shown in FIG. 2, the actuator 104 is pivotably supported at a first or distal end 104A of the actuator 104 relative to an adjacent component (e.g., by being pivotably coupled to the first adjacent component 82 of the harvester 10) and is pivotably coupled to the residue spreader 74 at an opposed second or proximal end 104B of the actuator 104 (e.g., via the first support arm 84). As such, with the configuration shown in FIG. 2, retraction of the actuator 104 in a first direction (indicated by arrow 107) may result in the residue spreader 74 being pivoted relative to the adjacent stationary components 82, 83 about the pivot points 80, 81 in the first pivot direction 86 while extension of the actuator 104 in an opposed, second direction (indicated by arrow 108) may result in the residue spreader 74 being pivoted relative to the adjacent stationary components 82, 83 about the pivot points 80, 81 in the opposite pivot direction 87.

It should be appreciated that, in several embodiments, the actuator 104 may correspond to any suitable actuation device or mechanism generally known in the art. For instance, in the illustrated embodiment, the actuator 104 corresponds to an electrical actuator configured to be extended/retracted by controlling the electrical input into the actuator. Specifically, the current supplied to the actuator 104 may be varied to regulate the retraction/extension of the actuator 104 and, thus, control the movement of the residue spreader 74. Alternatively, the actuator 104 may correspond any other suitable actuation device or mechanism, such as a pneumatic or hydraulic cylinder. In such an embodiment, the pressure of the fluid supplied to the cylinder (e.g., air or hydraulic fluid, such as oil) may be varied to regulate the retraction/extension of the actuator 104 and, thus, control the movement of the residue spreader 74.

Additionally, as shown in FIG. 2, the passive lift support 106 is pivotably supported at a first or distal end 106A of the lift support 106 relative to an adjacent component (e.g., by being pivotably coupled to the second adjacent component 83 of the harvester 10) and is pivotably coupled to the residue spreader 74 at an opposed second or proximal end 106B of the lift support 106 (e.g., via the second support arm 85). As such, with the configuration shown in FIG. 2, the passive lift support 106 may be configured to provide a supplement lift or actuation force when the actuator 104 is being retracted to pivot the residue spreader in the first pivot direction 86 towards its vertically oriented position and may be configured to dampen or support the movement of the residue spreader 74 when the actuator 104 is being extended to pivot the spreader 74 in the opposed pivot direction 87 towards its horizontally oriented position.

It should be appreciated that, in several embodiments, the passive lift support 106 may correspond to any suitable lift support generally known in the art. For instance, in one embodiment, the lift support 106 may correspond to a gas-charged lift support (also referred to as a gas strut, gas shock, or gas spring). In such an embodiment, the gas-charged cylinder of the lift support 106 may, for example, be configured to provide an additional force (e.g., a push or pull force) on one direction and may control the speed of motion in the other direction (or in both directions) via an internal damping circuit. In other embodiments, the passive lift support may correspond to any other suitable lift support and/or may have other suitable configuration. For instance, in an alternative embodiment, the passive lift support may correspond to a compression spring or a torsion spring.

As indicated above, passive lift supports often have a limited service life, particularly compared to an actively controlled actuator (e.g., an electric actuator or a fluid-driven actuator). As a result, the ability of the passive lift support 106 to assist the actuator 104 in moving the residue spreader 74 will degrade with time (e.g., due to seal leakage of the internal compressed gas). Thus, the proportion of the lifting or pivot force that must be supplied by the actuator 104 to move the residue spreader 74 across its range of movement will increase as the passive lift support 106 wears or degrades over time, which can result in the actuator 104 being overloaded or prematurely wearing or degrading due to the increase load.

To prevent the degraded performance of the passive lift support 106 from becoming a potential performance issue for the actuator 104, the disclosed system 100 is configured to automatically monitor the operational status of the passive lift support 106 to allow a determination to be made as to when the lift support 106 needs to be replaced. Specifically, as will be described below, the system 100 may include a computing system 110 that is configured to monitor a parameter associated with the actuator 104 that is indicative of the proportion of the load being carried by or applied through the actuator 104 (e.g., as opposed to the passive lift support 106) as the residue spreader 74 (or any other suitable actuatable component) is being moved across its range of movement. For example, in several embodiments, the monitored load-related parameter may correspond to a parameter that varies as a function of the load being carried by the actuator 104, such as by monitoring the current load (e.g., in amps) in instances in which the actuator 104 corresponds to an electric actuator and/or by monitoring the fluid pressure in instances in which the actuator 104 corresponds to a fluid-driven actuator (e.g., a pneumatic or hydraulic cylinder). In such embodiments, the computing system 110 may, for instance, be configured to compare the monitored load-related parameter to a corresponding threshold (e.g., a predetermined threshold value) to determine when the proportion of the load being carried by the actuator 104 exceeds a given magnitude, thereby indicating that the passive lift support 106 likely needs to be replaced as it is no longer providing the desired amount of supplemental actuation force to assist the actuator 104 in moving the residue spreader 74.

Figure 3:
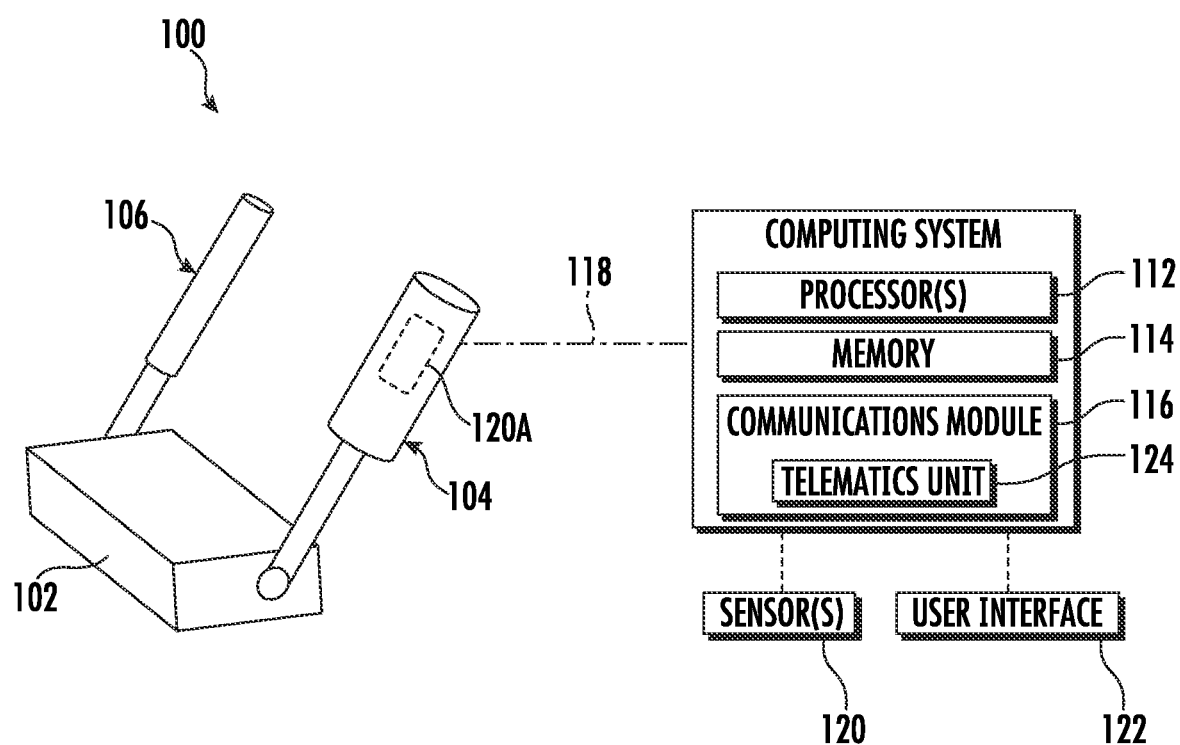
FIG. 3 illustrates another simplified, schematic view of another embodiment of a system for monitoring the operational status of passive lift supports in accordance with aspects of the present subject matter, particularly illustrating the system including an actuator and lift support coupled to an actuatable component in accordance with aspects of the present subject matter.

Referring now to FIG. 3, a schematic view of another embodiment of a system 100 for monitoring the operational status of a passive lift support is illustrated in accordance with aspects of the present subject matter. Similar to the embodiment described above, the system 100 may generally include an actuatable component 102 configured to be moved across a range of movement between a first position and a second position, one or more actuators 104 configured to be actively controlled to actuate the component 102 across the range of movement, and at least one passive lift support 106 configured to assist the actuator(s) 104 in actuating or moving the component 102 (e.g., by providing an additional or supplemental actuation force).

Additionally, as shown in FIG. 3, the system 100 includes a computing system 110 configured to execute various computer-implemented functions. In general, the computing system 110 may comprise any suitable processor-based device known in the art, such as a computing device or any suitable combination of computing devices. Thus, in several embodiments, the computing system 110 may include one or more processor(s) 112 and associated memory device(s) 114 configured to perform a variety of computer-implemented functions. As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. Additionally, the memory device(s) 114 of the computing system 110 may generally comprise memory element(s) including, but not limited to, a computer readable medium (e.g., random access memory (RAM)), a computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 114 may generally be configured to store suitable computer-readable instructions that, when implemented by the processor(s) 112, configure the computing system 110 to perform various computer-implemented functions, such as one or more aspects of the methods or algorithms described herein.

In addition, the computing system 110 may also include various other suitable components, such as a communications circuit or module, one or more input/output channels, a data/control bus and/or the like. For instance, the computing system 110 may include a communications module or interface 116 to allow the computing system 110 to communicate with any of the various other system components described herein.

In several embodiments, the computing system 110 may be configured to automatically control the operation of the actuator 104 to allow the actuatable component 102 to be actuated or moved across its range of movement, such as from a first position to a second position. For instance, in the illustrated embodiment, the actuator 104 is configured as an electric actuator. In such an embodiment, the computing system 110 may be communicatively coupled to the actuator 104 (e.g., via communicative link 118) to allow the computing system 110 to transmit control signals for regulating the current supplied to the electric actuator, thereby allowing the computing system 110 to control the degree of extension/retraction of the actuator 104. Alternatively, in an embodiment in which the actuator 104 corresponds to a fluid-driven actuator (e.g., a hydraulic or pneumatic cylinder), the computing system 110 may be communicatively to a suitable control valve(s) to regulate the supply of fluid from a pressurized fluid source (e.g., a pump) to the fluid-driven actuator, thereby allowing the computing system 110 to control the degree of extension/retraction of the actuator 104.

Additionally, in accordance with aspects of the present subject matter, the computing system 110 may be configured to automatically monitor the operational status of the passive lift support 106. Specifically, in several embodiments, the computing system 110 may be configured to monitor a load-related parameter associated with the actuator 104 that is indicative of the load being carried by or applied through the actuator 104 (e.g., as opposed to the passive lift support) as the actuatable component 102 is being moved across its range of movement. In such embodiments, the computing system 110 may be communicatively coupled to any suitable sensor(s) 120 that facilitates the monitoring of such parameter. For example, in the illustrated embodiment in which the actuator 104 comprises an electric actuator, the computing system 110 may be configured to communicatively coupled to a sensor(s) 120 that generates data indicative of the electric input being supplied to the actuator 104, such as by being coupled to an internal sensor 120A of the actuator 104 that measures the current (e.g., in amps) suppled thereto. Since electric actuators typically have a known load-to-current relationship (e.g., a linear relationship), the monitored current is directly related to the specific load being applied through the actuator 104. Thus, as the proportion of the load being carried by the actuator 104 increases over time as the performance of the passive lift support 106 degrades, such increased load will result in a corresponding increase in the monitored current. Accordingly, by monitoring the current supplied to the actuator 104 and comparing the monitored current to a corresponding threshold, it can be determined when the operational status of the passive lift support 106 has been sufficiently degraded such that replacement of the lift support 106 is required or at least recommended.

It should be appreciated that, in other embodiments, the monitored load-related parameter may correspond to any other suitable parameter. For instance, in an embodiment in which the actuator 104 corresponds to a fluid-driven actuator (e.g., a hydraulic or pneumatic cylinder), the computing system 110 may be configured to monitor the pressure of the fluid being supplied to the actuator 104. In such an embodiment, the sensor(s) 120 may correspond to a pressure sensor configured to generate data indicative of the fluid pressure supplied to the actuator 104.

In one embodiment, to establish a threshold for evaluating the monitored load-related parameter (e.g., current or fluid pressure), the computing system 110 may be configured to execute a calibration routine when the passive lift support 106 is fully operational (e.g., when the lift support 106 is newly installed during manufacturing of the associated machine and/or upon replacement of the passive lift support 106). To execute the calibration routine, the computing system 110 may be configured to control the operation of the actuator 104 to move or actuate the actuatable component 102 across its range of movement (e.g., from a first position to a second position) while recording the associated load-related parameter based on data received from the sensor(s) 120 at one or more calibration locations along the range of movement. The recorded parameter value(s) may then be used as a baseline value(s) for selecting or calculating an associated threshold value(s) for the monitored parameter at which it will be inferred that the operational status of the passive lift support 106 is sufficiently degraded and, thus, replacement is required (or at least recommended). For instance, the threshold value(s) may be set as a predetermined percentage of the baseline value(s) recorded during the calibration procedure. Thereafter, each time the component 102 is being subsequently actuated across its range of movement, the computing system 110 may monitor the load-related parameter (e.g., based on the data from the sensor(s) 120) as the component 102 is moved past each calibration location. The newly recorded value(s) for the load-related parameter (or an average for the recorded values) can then be compared to the threshold value(s) to determine if the passive lift support is still adequately functioning.

Referring still to FIG. 3, when it is determined that the passive lift support 106 is no longer sufficiently assisting the actuator 104 (e.g., based on the comparison of the recoded value(s) to the threshold value(s)), the computing system 110 may be further configured to automatically initiate one or more control actions. For example, the computing system 110 may be configured to provide the operator with a notification that the passive lift support 106 needs to be replaced. Specifically, in one embodiment, the computing system 110 may be communicatively coupled to a user interface 122 of the associated work machine via a wired or wireless connection to allow notification signals to be transmitted from the computing system 110 to the user interface 122. In such an embodiment, the notification signals may cause the user interface 122 to present a notification to the operator (e.g., by causing a visual or audible notification or indicator to be presented to the operator) providing an indication that the passive lift support 106 needs to be replaced. In such instance, the operator may then choose to initiate any suitable corrective action he/she believes is necessary, such as by actually replacing the lift support 106 or by scheduling a maintenance/service operation for the agricultural machine.

In addition to the operator notification (or as an alternative thereto), the computing system 110 may be configured to automatically transmit a notification related to the passive lift support 106 to a separate device located remote to the agricultural machine, such as a remote server or computing device. For instance, as shown in FIG. 3, the communications module 116 may include or be communicatively coupled to a telematics units 124 for transmitting notifications and other data via a wireless network to one or more remote systems/devices. In such an embodiment, the notification may be sent, for example, to a remote system/device that is configured to notify a given dealer or service technician that the passive lift support 206 for the associated agricultural machine needs to be replaced or serviced.

Additionally, in several embodiments, the control action(s) executed by the computing system 110 may include automatically adjusting one or more aspects of the operation of the agricultural machine. For instance, in one embodiment, when it is determined that the passive lift support 106 is no longer sufficiently assisting the actuator 104 with actuation of the associated component 102, the computing system 110 may be configured to automatically adjust operation of the actuator 104 to prevent damage to or excessive wear of the actuator 104 prior to the passive lift support 106 being replaced, such as by adjusting (e.g., limiting) the stroke length of the actuator 104.

Figure 4:
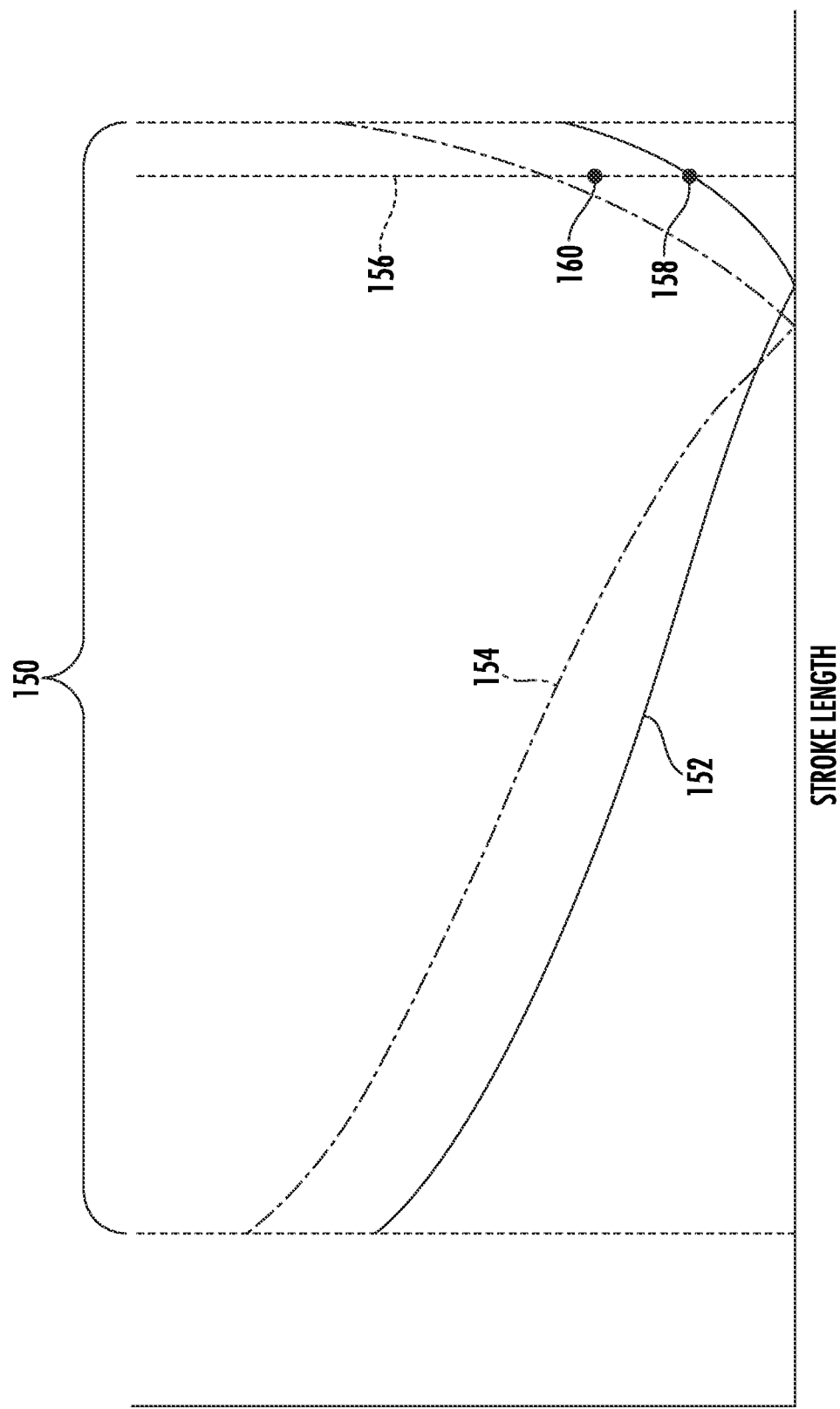
FIG. 4 illustrates exemplary operating curves plotted for an actuator configured to be used within embodiments of the disclosed system to actuate a given actuatable component across a range of movement, particularly illustrating an example of a specific point-based or location-based threshold value that can be selected for assessing a monitored load-related parameter of the actuator as the performance of the associated passive lift support begins to degrade.

Referring now to FIG. 4, exemplary operating curves are plotted for an actuator 104 (e.g., an electric actuator) configured to be used within embodiments of the disclosed system 100 to actuate a given actuatable component 102 across a range of movement 150, particularly plotting the monitored load-related parameter (e.g., current) along the y-axis and the actuator's stroke length associated with the range of movement 150 along the x-axis. Specifically, FIG. 4 includes a first operating curve 152 that plots the load-related parameter across the range of movement 150 when the associated passive lift support 106 is fully operational (and, thus, provides a given amount of supplemental force for moving the component 102) and a second operating curve 154 that plots the load-related parameter across the range of movement 150 when the passive lift support 106 is not functioning at all (or is otherwise not present) such that the entirety of the load is being carried by the actuator 104. As shown, a significant differential exists between the first and second operating curves 152, 154 across the majority of the range of movement 150, which is generally representative of the additional or supplemental force provided by the passive lift support 106 during actuation of the associated component 102. However, as the performance of the passive lift support 106 degrades over time, the actual operating curve for the actuator 104 will shift from the first operating curve 152 towards the second operating curve 154.

FIG. 4 also illustrates an example of a specific point-based or location-based threshold value that can be selected for assessing the monitored load-related parameter as the performance of the passive lift support 106 begins to degrade. Specifically, as indicated above, the computing system 110 may be configured to execute a calibration routine during which the operation of the actuator 104 is controlled to move or actuate the actuatable component 102 across its range of movement 150 while the load-related parameter for the actuator 104 is being monitored at one or more calibration locations defined along the range of movement 150. For example, as shown in FIG. 4, a calibration location (indicated by vertical line 156) has been selected at a given position along the associated range of movement 150. Thus, during the calibration procedure, the computing system 110 may be configured to record the value of the load-related parameter at the calibration location (e.g., indicated at 158). A threshold value (e.g., indicated at 160) may then be selected as a function of this baseline value 158 (e.g., by setting the threshold value 160 as a given percentage of the baseline value 158).

Thereafter, each time the actuator 104 is subsequently extended/retracted across the calibration location 156 as the associated component 102 is being moved between its respective positions, the computing system 110 may record a new value for the load-related parameter at the calibration location 156 and compare it to the predetermined threshold value 160. As shown in FIG. 4, with the lift support 106 fully functional (e.g., as indicated by operating curve 152), the value of the load-related parameter at the calibration location 156 (e.g., baseline value 158) will be significantly less than the threshold value 160. However, the value of the monitored load-related parameter will increase over time as the proportion of the load being carried by the actuator 104 increases with degradation of the performance of the passive lift support 106. Thus, the computing system 110 may be configured to continuously monitor the parameter with each actuation across the calibration location 156 to determine when the recorded value reaches or exceeds the threshold value 160, at which point it may be determined that the passive lift support 106 needs to be replaced.

Figure 5:
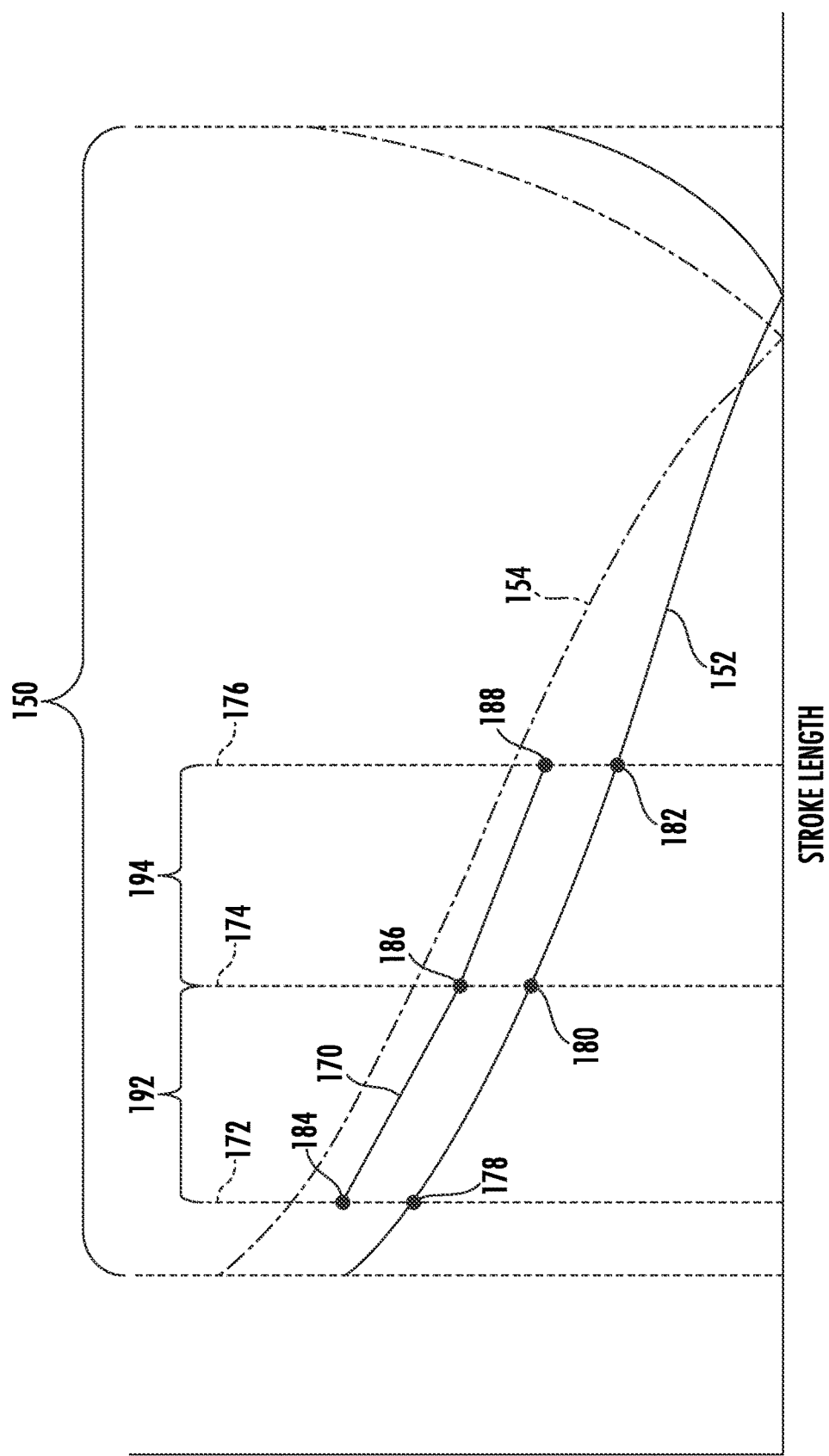
FIG. 5 illustrates another graphical view of the exemplary operating curves shown in FIG. 4, particularly illustrating an example of a threshold curve that can be used to evaluate a monitored load-related parameter of the actuator as the performance of the associated passive lift support begins to degrade.

Referring now to FIG. 5, another graphical view of the exemplary operating curves 152, 154 shown in FIG. 4 are illustrated in accordance with aspects of the present subject matter, particularly illustrating an example of a threshold curve 170 that can be used to evaluate the monitor load-related parameter for the actuator 104. As shown in FIG. 5, numerous calibration locations (indicated by vertical lines 172, 174, 176) have been selected at various spaced-apart positions along the associated range of movement 150. In such an embodiment, during the calibration procedure, the computing system 110 may be configured to record the value of the load-related parameter at each respective calibration location 172, 174, 176 (e.g., indicated at points 178, 180, 182). Corresponding threshold values for each calibration location (e.g., indicated at points 184, 186, 188) may then be selected as a function of the respective baseline values 178, 180, 182 (e.g., by setting each threshold value as a given percentage of the respective baseline value).

A threshold curve 170 may then be generated that passes through each of the threshold values 184, 186, 188. For instance, in one embodiment, the threshold curve 170 may be generated by defining each section 192, 194 of the range of movement 150 (or each section of the stroke length) extending between neighboring calibration locations 172, 174, 176 as a linear function (e.g., y=mx+b). The linear function may then be used to determine an average threshold value across each section 192, 194 of the range of movement 150 that can be used as the basis for evaluating the monitored load-related parameter during subsequent operation of the actuator 104. Specifically, each time the actuator 104 is subsequently extended/retracted across a given section 192, 194 of the range of movement 150, the computing system 110 may record the values of the load-related parameter along portions of the stroke length associated with such section 192, 194 of the range of movement 150 and determine an average value for the monitored load-related parameter across the section 192, 194. The average value determined by the computing system 110 may then be compared to the average threshold value associated with the respective section 192, 194 of the range of movement 150 to evaluate the operating status of the passive lift support 106. Specifically, in the embodiment shown in FIG. 5, when the monitored average value for the load-related parameter exceeds the threshold average value for a given section 192, 194 of the range of movement 150, it may be determined that the passive lift support 106 needs to be replaced. Using an average force value can be beneficial to account for variations in actuation force due to external factors such as friction and wear, temperature, and debris accumulation on the system.

Figure 6:
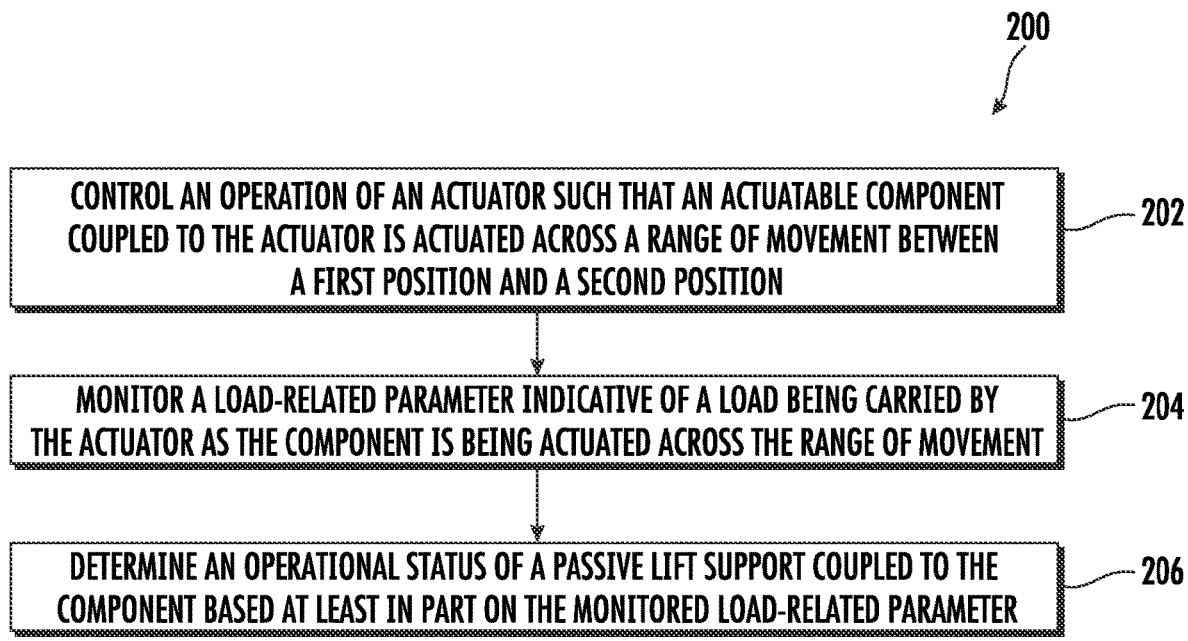
FIG. 6 illustrates a flow diagram of one embodiment of a method for monitoring the operational status of passive lift supports in accordance with aspects of the present subject matter.

Referring now to FIG. 6, a flow diagram of one embodiment of a method 200 for monitoring the operational status of passive lift supports is illustrated in accordance with aspects of the present subject matter. In general, the method 200 will be described herein with reference to the embodiments of the system 100 described above with reference to FIGS. 2 and 3. However, it should be appreciated by those of ordinary skill in the art that the disclosed method 200 may generally be utilized in association with systems having any other suitable system configuration. In addition, although FIG. 6 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

As shown in FIG. 6, at (202) the method 200 includes controlling an operation of an actuator such that an actuatable component coupled to the actuator is actuated across a range of movement between a first position and a second position. Specifically, as indicated above, the computing system 110 may be configured to control the operation of the actuator 104 to actuate or move an associated component 102 across a range of movement, such as by actuating the residue spreader 74 of the harvester 10 described above between its operating and storage positions.

Additionally, at (204), the method 200 includes monitoring a load-related parameter indicative of a load being carried by the actuator as the component is being actuated across the range of movement. As indicated above, the computing system 110 may be communicatively coupled to one or more sensors 120 configured to generate data associated with a load-related parameter of the actuator 104, such as one or more sensors configured to monitor the electric input into the actuator and/or the fluid pressure supplied to the actuator. In such an embodiment, the computing system 110 may be configured to monitor the load-related parameter based on the data received from the sensor(s) 120.

Moreover, at (206), the method 200 includes determining, with the computing system, an operational status of a passive lift support coupled to the component based at least in part on the monitored load-related parameter. For instance, as indicated above, the computing system 110 may be configured to compare the monitored load-related parameter to one or more predetermined threshold values to evaluate the operational status of the associated passive lift support 106. The predetermined threshold value(s) may, for example, derive from a calibration routine executed by the computing system 110 when the passive lift support 106 is new or otherwise fully functional to establish baseline data for the actuator 104 prior to any degradation of the performance of the lift support 106.

It is to be understood that the steps of the method 200 are performed by the computing system 110 upon loading and executing software code or instructions which are tangibly stored on a tangible computer readable medium, such as on a magnetic medium, e.g., a computer hard drive, an optical medium, e.g., an optical disc, solid-state memory, e.g., flash memory, or other storage media known in the art. Thus, any of the functionality performed by the computing system 110 described herein, such as the method 200, is implemented in software code or instructions which are tangibly stored on a tangible computer readable medium. The computing system 110 loads the software code or instructions via a direct interface with the computer readable medium or via a wired and/or wireless network. Upon loading and executing such software code or instructions by the computing system 110, the computing system 110 may perform any of the functionality of the computing system 110 described herein, including any steps of the method 200 described herein.

The term "software code" or "code" used herein refers to any instructions or set of instructions that influence the operation of a computer or controller. They may exist in a computer-executable form, such as machine code, which is the set of instructions and data directly executed by a computer's central processing unit or by a controller, a human-understandable form, such as source code, which may be compiled in order to be executed by a computer's central processing unit or by a controller, or an intermediate form, such as object code, which is produced by a compiler. As used herein, the term "software code" or "code" also includes any human-understandable computer instructions or set of instructions, e.g., a script, that may be executed on the fly with the aid of an interpreter executed by a computer's central processing unit or by a controller.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A system for monitoring an operational status of passive lift supports, the system comprising:
    a component configured to be moved across a range of movement between a first position and a second position;
    an actuator coupled to the component and being configured to actuate the component across the range of movement;
    a passive lift support coupled to the component and being configured to provide a supplemental actuation force as the actuator is being used to actuate the component across the range of movement;
    a computing system configured to monitor a load-related parameter indicative of a load being carried by the actuator, the computing system being further configured to determine the operational status of the passive lift support based at least in part on the monitored load-related parameter.

2. The system of claim 1, wherein the computing system is further configured to compare the monitored load-related parameter to at least one threshold, the computing system being further configured to determine the operational status of the passive lift support based on the comparison between the monitored load-related parameter and the at least one threshold.

3. The system of claim 2, wherein the actuator is configured to be extended or retracted along a stroke length to actuate the component across the range of movement and wherein the at least one threshold comprises a threshold value associated with a predetermined location along the stroke length of the actuator, the computing system being further configured to record a value of the load-related parameter at the predetermined location as the actuator is being extended or retracted past the predetermined location and compare the recorded value to the threshold value.

4. The system of claim 2, wherein the actuator is configured to be extended or retracted along a stroke length to actuate the component across the range of movement and wherein the at least one threshold comprises an average threshold value associated with a predetermined section of the stroke length of the actuator, the computing system being further configured to determine an average value of the load-related parameter as the actuator is being extended or retracted across the predetermined section of the stroke length and compare the average value to the average threshold value.

5. The system of claim 2, wherein the computing system is further configured to execute a calibration routine during which the computing system: (1) automatically extends or retracts the actuator along a stroke length to actuate the component across at least a portion of the range of movement; and (2) records one or more baseline values for the load-related parameter at one or more respective locations along the stroke length, wherein the at least one threshold is determined based at least in part on the one or more baseline values.

6. The system of claim 1, wherein the passive lift support comprises a gas-charged lift support.

7. The system of claim 1, wherein the load-related parameter comprises at least one of a current supplied to the actuator or a pressure of a fluid supplied to the actuator.

8. The system of claim 1, wherein the computing system is further configured to initiate a control action based on the determined operational status of the passive lift support.

9. A work machine, comprising:
a frame;
component supported for movement relative to the frame across a range of movement between a first position and a second position;
an actuator coupled to the component and being configured to be extended or retracted along a stroke length to actuate the component across the range of movement;
a passive lift support coupled to the component and being configured to provide a supplemental actuation force as the actuator is being used to actuate the component across the range of movement;
a computing system configured to monitor a load-related parameter indicative of a load being carried by the actuator and compare the monitored load-related parameter to at least one threshold, the computing system being further configured to determine an operational status of the passive lift support based on the comparison between the monitored load-related parameter and the at least one threshold.

10. The work machine of claim 9, wherein the at least one threshold comprises a threshold value associated with a predetermined location along the stroke length of the actuator, the computing system being further configured to record a value of the load-related parameter at the predetermined location as the actuator is being extended or retracted past the predetermined location and compare the recorded value to the threshold value.

11. The work machine of claim 9, wherein the at least one threshold comprises an average threshold value associated with a predetermined section of the stroke length of the actuator, the computing system being further configured to determine an average value of the load-related parameter as the actuator is being extended or retracted across the predetermined section of the stroke length and compare the average value to the average threshold value.

12. The work machine of claim 9, wherein the computing system is further configured to execute a calibration routine during which the computing system: (1) automatically extends or retracts the actuator along the stroke length to actuate the component across at least a portion of the range of movement; and (2) records one or more baseline values for the load-related parameter at one or more respective locations along the stroke length, wherein the at least one threshold is determined based at least in part on the one or more baseline values.

13. The work machine of claim 9, wherein the passive lift support comprises a gas-charged lift support.

14. The work machine of claim 9, wherein the work machine is a harvester and the component is a residue spreader of the harvester.

15. The work machine of claim 9, wherein the computing system is further configured to initiate a control action based on the determined operational status of the passive lift support, the control action comprising at least one of:
controlling a user interface to provide a notification to an operator of the work machine related to the operational status of the passive lift support;
transmitting a notification to a remote device related to the operational status of the passive lift support; or
automatically adjusting the stroke length of the actuator.

16. A method for monitoring an operational status of a passive lift support, the method comprising:
controlling, with a computing system, an operation of an actuator such that component coupled to the actuator is actuated across a range of movement between a first position and a second position, the passive lift support being coupled to the actuator and being configured to provide a supplemental actuation force as the actuator is being used to actuate the component across the range of movement;
monitoring, with the computing system, a load-related parameter indicative of a load being carried by the actuator as the component is being actuated across the range of movement; and
determining, with the computing system, the operational status of the passive lift support based at least in part on the monitored load-related parameter.

17. The method of claim 16, further comprising comparing the monitored load-related parameter to at least one threshold, wherein determining the operational status of the passive lift support comprises determining the operational status of the passive lift support based on the comparison between the monitored load-related parameter and the at least one threshold.

18. The method of claim 17, wherein the actuator is configured to be extended or retracted along a stroke length to actuate the component across the range of movement and wherein the at least one threshold comprises a threshold value associated with a predetermined location along the stroke length of the actuator;
wherein monitoring the load-related parameter comprises recording a value of the load-related parameter at the predetermined location as the actuator is being extended or retracted past the predetermined location; and wherein comparing the monitored load-related parameter to at least one threshold comprising comparing the recorded value to the threshold value.

19. The method of claim 17, wherein the actuator is configured to be extended or retracted along a stroke length to actuate the component across the range of movement and wherein the at least one threshold comprises an average threshold value associated with a predetermined section of the stroke length of the actuator;

wherein monitoring the load-related parameter comprises determining an average value of the load-related parameter as the actuator is being extended or retracted across the predetermined section of the stroke length; and wherein comparing the monitored load-related parameter to at least one threshold comprising comparing the average value to the average threshold value.

20. The method of claim 17, further comprising:

controlling the operation of the actuator during a calibration routine to extend or retract the actuator along a stroke length to actuate the component across at least a portion of the range of movement;

recording one or more baseline values for the load-related parameter at one or more respective locations along the stroke length; and determining the at least one threshold based at least in part on the one or more baseline values.

* * * * *